United States Patent
Yamazaki et al.

(10) Patent No.: US 6,168,980 B1
(45) Date of Patent: *Jan. 2, 2001

(54) SEMICONDUCTOR DEVICE AND METHOD FOR FORMING THE SAME

(75) Inventors: Shunpei Yamazaki, Tokyo; Hongyong Zhang, Kanagawa, both of (JP)

(73) Assignee: Semiconductor Energy Laboratory Co., Ltd., Kanagawa (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/721,526

(22) Filed: Sep. 26, 1996

Related U.S. Application Data

(63) Continuation of application No. 08/111,522, filed on Aug. 25, 1993, now abandoned.

(30) Foreign Application Priority Data

Aug. 27, 1992 (JP) .................................................. 4-252296
Jun. 24, 1993 (JP) .................................................. 5-177410
Jul. 6, 1993 (JP) .................................................. 5-191934

(51) Int. Cl.[7] ................................................ H01L 21/316
(52) U.S. Cl. .................... 438/162; 438/166; 438/476; 438/486; 438/287
(58) Field of Search .................................... 437/173, 174, 437/907, 908, 21, 101, 40, 41, 235, 238; 148/DIG. 4, DIG. 90, DIG. 91, DIG. 60; 438/166, 162, 476, 486, 287

(56) References Cited

U.S. PATENT DOCUMENTS

| Re. 28,385 | * | 4/1975 | Mayer . |
| Re. 28,386 | * | 4/1975 | Heiman et al. . |
| 3,783,049 | | 1/1974 | Sandera . |
| 4,231,809 | * | 11/1980 | Schmidt . |
| 4,585,492 | * | 4/1986 | Weinberg et al. .............. 148/DIG. 4 |
| 4,727,044 | | 2/1988 | Yamazaki . |
| 4,784,975 | * | 11/1988 | Hofmann et al. ............... 148/DIG. 4 |
| 4,810,673 | * | 3/1989 | Freeman ............................... 437/239 |

(List continued on next page.)

FOREIGN PATENT DOCUMENTS

| 0 178 447 | 4/1986 | (EP) . |
| EP0 459 763 | 5/1997 | (EP) . |

(List continued on next page.)

OTHER PUBLICATIONS

Translation of JP 2–140915, May 1990.*
P.H. Robinson et al., J. Electrochem. Soc. 118(1)(1971)141 "Use of HCl gettering in silicon . . . ", Jan. 1971.*

(List continued on next page.)

Primary Examiner—Charles Bowers
Assistant Examiner—Matthew Whipple
(74) Attorney, Agent, or Firm—Nixon Peabody LLP

(57) ABSTRACT

A low temperature process for fabricating a high-performance and reliable semiconductor device in high yield, comprising forming a silicon oxide film as a gate insulator by chemical vapor deposition using TEOS as a starting material under an oxygen, ozone, or a nitrogen oxide atmosphere on a semiconductor coating having provided on an insulator substrate; and irradiating a pulsed laser beam or an intense light thereto to remove clusters of such as carbon and hydrocarbon to thereby eliminate trap centers from the silicon oxide film.

Also claimed is a process comprising implanting nitrogen ions into a silicon oxide film and annealing the film thereafter using an infrared light, to thereby obtain a silicon oxynitride film as a gate insulator having a densified film structure, a high dielectric constant, and an improved withstand voltage.

29 Claims, 7 Drawing Sheets

U.S. PATENT DOCUMENTS

| | | |
|---|---|---|
| 4,851,370 | 7/1989 | Doklan et al. ............................ 437/225 |
| 4,885,258 * | 12/1989 | Ishihara et al. ........................... 437/40 |
| 4,894,352 * | 1/1990 | Lane et al. . |
| 4,963,503 * | 10/1990 | Aoki et al. ................................. 437/907 |
| 5,010,037 | 4/1991 | Lin et al. . |
| 5,075,259 | 12/1991 | Moran . |
| 5,077,233 | 12/1991 | Mukai . |
| 5,124,014 * | 6/1992 | Foo et al. ................................... 437/238 |
| 5,147,826 * | 9/1992 | Liu et al. .................................... 437/233 |
| 5,225,355 * | 7/1993 | Sugino et al. ............................. 437/10 |
| 5,237,188 * | 8/1993 | Iwai ........................................... 257/325 |
| 5,244,819 * | 9/1993 | Yue ............................................ 437/11 |
| 5,264,383 * | 11/1993 | Young .................................. 437/40 TFT |
| 5,275,851 * | 1/1994 | Fonash et al. ............................ 437/233 |
| 5,278,093 * | 1/1994 | Yonehava ................................. 437/173 |
| 5,298,075 | 3/1994 | Lagendijk et al. . |
| 5,300,187 * | 4/1994 | Lesk et al. ................................ 437/13 |
| 5,302,855 * | 4/1994 | Matsumoto et al. . |
| 5,308,998 * | 5/1994 | Yamazaki et al. . |
| 5,313,075 * | 5/1994 | Zhang et al. . |
| 5,313,076 * | 5/1994 | Yamazaki et al. . |
| 5,314,724 * | 5/1994 | Tsukune et al. . |
| 5,317,236 * | 5/1994 | Zavracky et al. ........................ 437/173 |
| 5,330,614 * | 7/1994 | Ahn ............................................ 437/915 |
| 5,330,929 * | 7/1994 | Pfiester et al. ............................ 437/200 |
| 5,352,291 * | 10/1994 | Zhang et al. ............................. 437/173 |
| 5,403,772 | 4/1995 | Zhang et al. . |
| 5,422,311 | 6/1995 | Woo . |
| 5,426,064 | 6/1995 | Zhang et al. . |
| 5,476,802 | 12/1995 | Yamazaki et al. ....................... 437/21 |
| 5,481,121 | 1/1996 | Zhang et al. . |
| 5,488,000 | 1/1996 | Zhang et al. . |
| 5,492,843 | 2/1996 | Adachi et al. . |
| 5,501,989 | 3/1996 | Takayama et al. . |
| 5,508,533 | 4/1996 | Takemura . |
| 5,523,240 | 6/1996 | Zhang et al. . |
| 5,529,937 | 6/1996 | Zhang et al. . |
| 5,534,716 | 7/1996 | Takemura . |
| 5,543,352 | 8/1996 | Ohtani et al. . |
| 5,563,426 | 10/1996 | Zhang et al. . |
| 5,569,610 | 10/1996 | Zhang et al. . |
| 5,569,936 | 10/1996 | Zhang et al. . |
| 5,580,792 | 12/1996 | Zhang et al. . |
| 5,585,291 | 12/1996 | Ohtani et al. . |
| 5,589,694 | 12/1996 | Takayama et al. . |
| 5,595,923 | 1/1997 | Zhang et al. . |
| 5,595,944 | 1/1997 | Zhang et al. . |
| 5,604,360 | 2/1997 | Zhang et al. . |
| 5,605,846 | 2/1997 | Ohtani et al. . |
| 5,606,179 | 2/1997 | Yamazaki et al. . |
| 5,608,232 | 3/1997 | Yamazaki et al. ....................... 257/66 |
| 5,612,250 | 3/1997 | Ohtani et al. . |
| 5,614,426 | 3/1997 | Funada et al. . |
| 5,614,733 | 3/1997 | Zhang et al. . |
| 5,616,506 | 4/1997 | Takemura . |
| 5,620,910 | 4/1997 | Teramoto . |
| 5,621,224 | 4/1997 | Yamazaki et al. . |
| 5,624,851 | 4/1997 | Takayama et al. . |
| 5,637,515 | 6/1997 | Takemura . |
| 5,639,698 | 6/1997 | Yamazaki et al. ................... 437/228 |
| 5,643,826 | 7/1997 | Ohtani et al. . |
| 5,646,424 | 7/1997 | Zhang et al. . |
| 5,654,203 | 8/1997 | Ohtani et al. . |
| 5,656,825 | 8/1997 | Kusumoto et al. . |
| 5,663,077 | 9/1997 | Adachi et al. . |
| 5,677,549 | 10/1997 | Takayama et al. . |
| 5,696,386 | 12/1997 | Yamazaki . |
| 5,696,388 | 12/1997 | Funada et al. . |
| 5,700,333 | 12/1997 | Yamazaki et al. ................... 136/258 |
| 5,705,829 | 1/1998 | Miyanaga et al. . |
| 5,712,191 | 1/1998 | Nakajima et al. . |
| 5,756,364 | 5/1998 | Tanaka et al. . |
| 5,773,325 * | 6/1998 | Teramoto et al. ................... 438/151 |
| 5,773,327 | 6/1998 | Yamazaki et al. . |

FOREIGN PATENT DOCUMENTS

| | | |
|---|---|---|
| 55-153339 | 11/1980 | (JP) . |
| 58-98933 | 6/1983 | (JP) . |
| 58-190020 | 11/1983 | (JP) . |
| 59-201422 * | 11 1984 | (JP) ............................ 148/DIG. 90 |
| 60-241269 | 11/1985 | (JP) . |
| 61-63020 * | 4/1986 | (JP) . |
| 61-89621 | 5/1986 | (JP) . |
| 61-166074 | 7/1986 | (JP) . |
| 62-33417 | 2/1987 | (JP) . |
| 63-105970 | 5/1988 | (JP) . |
| 64-25515 * | 1/1989 | (JP) . |
| 64-37029 | 2/1989 | (JP) . |
| 1-128572 | 5/1989 | (JP) . |
| 1-149475 | 6/1989 | (JP) . |
| 1-187814 * | 7/1989 | (JP) ............................ 148/DIG. 90 |
| 1-238024 | 9/1989 | (JP) . |
| 2-140915 * | 5/1990 | (JP) . |
| 2-148831 * | 6/1990 | (JP) ..................................... 437/908 |
| 2-189954 * | 7/1990 | (JP) . |
| 2-224253 | 9/1990 | (JP) . |
| 2-295111 * | 12 1990 | (JP) ..................................... 117/904 |
| 3-34434 | 2/1991 | (JP) . |
| 3-133131 * | 6/1991 | (JP) . |
| 3-132041 | 6/1991 | (JP) . |
| 5-55246 | 8/1991 | (JP) . |
| 3-203329 * | 9/1991 | (JP) . |
| 4-102375 * | 4/1992 | (JP) . |
| 4-110470 | 4/1992 | (JP) . |
| 4-165679 | 6/1992 | (JP) . |
| 4-284675 | 10/1992 | (JP) . |
| 5-58789 | 3/1993 | (JP) . |
| 62-119974 | 6/1997 | (JP) . |

OTHER PUBLICATIONS

J.M. Green et al., IBM Tech. Discl. bulletin 16(5)(1973)1612 "Method to purify semiconductor wafers", Oct. 1973.*

S. Wolf and R.N. Taubev, "Silicon Processing for the VLSI Era", Lattice Press 1986, p. 182–185, 194–195.*

M. Morita, et al., Appl. Phys. Lett., 49(12)1986, p. 699, "F–enhanced Photo Oxidation of Si . . . ".*

Kuginiya, K., et al., Japanese J. Appl. Phy. 22(1) 1982, p. L19–L21, "CW Laser Annealing of . . . ".*

Japanese J. Appl. Phys., 33(1B) 1994, p. 408–412 "Low Dielectric Constant Interlayer . . . ", Abstract Only.*

Translations of JP 4–102375, 2–148831 and 1–187814 cited previously.*

K.B. Kadyrakunov, et al., Phys. Stat. Sol., A70, (1982) K15 ". . . Pulsed Annealing of Si–SiO$_2$ Structures".*

D.L. Crosthwait, et al., Mrs Proc., Fall 1980, Laser and Electron–Beam Solid Interactions . . . , p. 399.*

T.I. Kamins et al., Solid St. Electron. 23(1980) 1037 ". . . Laser Annealed Insulators on Silicon".*

S.K. Ghandhi "VLSI Fabrication Principles" p.389–392, Jan. 1982.*

C. Hayzelden et al. "In situ transmission electron microscopy studies of silicide–mediated crystallization of amorphous silicon", (3 pages).

S. Caune et al., "Combined CW Laser and Furnace Annealing of Amorphous Si and Ge in Contact with Some Metals", Applied Surface Science 36 (1989) 597–604.

A. V. Dvurechenskii et al., "Transport Phenomena in Amorphous Silicon Doped by Ion Implanted of 3d Metals", Phys. Stat. Sol (a) 95, (1986) 635–640.

F. Fortuna et al., "In siti study of ion beam induced Si crystallization from a silicide interface", Applied Surface Science 73 (1993) 264–267.

S.F. Gong et al. "Thermodynamic Investigations of Solid–State Si–metla Interactions.II. General Analysis of Si–metal Binary Systems", J. Appl. Phys. 68(9), Nov. 1, 1990, 4542–4549.

C. Hayzelden et al. "In situ transmission electron microscopy studies of silicide–mediated crystallization of amorphous silicon", (3 pages).

T. Hempel et al., "Needle–Like Crystallization of Ni Doped Amorphous Silicon Thin Films", Solid State Communications, vol. 85, No. 11, 1993, pp. 921–924.

R. Kakkad et al., "Low Temperature Selective Crystallization of Amorphous Silicon", Journal of Non–Crystalline Solids 115 (1989) 66–68.

R. Kakkad et al., "Crystallized Si films by low–temperature rapid thermal annealing of amorphous silicon", J. Appl. Phys. 65(5), Mar. 1, 1989, 2069–2072.

Y. Kawazu et al., "Low–Temperature Crystallization of Hydrogenated Amorphous Silicon Induced by Nickel Silicide Formation", Japanese Journal of Applied Physics, vol. 29, No. 12, Dec., 1990, pp. 2698–2704.

S–W. Lee et al., "Low Temperature Poly–Si TFT Fabrication by Nickel–Induced Lateral Crystallization of Amorphous Silicon Films", AM–LCD 95, Digest of Technical Papers, 1995, 113–116.

S–W. Lee et al., "Pd induced lateral crystallization of amorphous Si thin films", Appl. Phys. Lett., vol. 66, No. 13, Mar. 27, 1995.

G. Liu et al., "Selective area crystallization of amorphous silicon films by low–temperature rapid thermal annealing", Appl. Phys. Lett., vol. 55, No. 7, Aug. 14, 1989, 660–662.

G. Liu et al., "Polycrystalline silicone thin film transistors on Corning 7059 glass substrates using short time, low–temperature processing", American Institute of Physics, 2554–2556.

R. Nemanich et al., "Structure and growth of the interface of Pd on a–Si–H", Physical Review 3, vol. 23, No. 12, Jun. 15, 1981.

R. Nemanich et al., "Initial Phase Formation at the Interface of Ni, Pd and Si" (6 pages).

M. Thompson et al. "Silicide formation in Pd–a–SiH Schottky barriers", Appl. Lett., vol. 39, No. 3, Aug. 1, 1981, (5 pages).

S. Wolf, "Silicon Processing for the VLSI Era" vol. 3, pp. 658–60, 671–72, 1995.*

* cited by examiner

SEMICONDUCTOR DEVICE AND METHOD FOR FORMING THE SAME

This application is a Continuation of Ser. No. 08/111,522, filed Aug. 25, 1993, now abandoned.

BACKGROUND OF THE INVENTION

1. Field of the Invention

The present invention relates to a semiconductor device using an insulator film, represented by a thin film transistor (referred to hereinafter as "TFT"), and to a process for fabricating the same. The present invention also relates to a process for fabricating, in high yield, a high-performance and reliable insulated gate semiconductor device on an insulator substrate under a temperature as low as 700° C. or even lower, and for fabricating an integrated circuit (IC) by assembling a plurality of such semiconductor devices.

The present device is useful as active matrices of liquid crystal displays, etc., driver circuits of image sensors, etc., and as TFTs of SOI (silicon on insulator) circuits and of conventional semiconductor ICs such as microprocessors, micro-controllers, microcomputers, and semiconductor memories.

2. Prior Art

Conventionally, liquid crystal display devices and image sensor devices are well known as devices using TFTs being integrated on a glass substrate. In general, insulated gate field effect semiconductor devices using thin film transistors are employed in the conventional devices above, and it is also customary to use a silicon oxide film as the gate insulators of those TFTs.

The TFTs using the silicon oxide film as the gate insulator, however, suffer problems such as the leak current ascribed to the pinholes in the gate insulator film, limits in increasing the film thickness (the capacity of a gate insulator depends on the film thickness and permittivity), instability in the required various properties as an insulator film due to the lack of density (that is, the film is too soft), and to the problems attributed to fixed charge such as sodium ions being incorporated in the gate insulator.

Recently, study is made intensively on the process for fabricating an insulated gate semiconductor device (MOSFET) on an insulator substrate. Those ICs having established on an insulator substrate are advantageous in their suitability to high speed drive, because, the ICs having established on an insulator need not suffer stray capacitance. In contrast to these ICs, the operation speed of a conventional IC is limited by a stray capacitance, i.e a capacitance between the connection and the substrate. The MOSFETs having formed on an insulator substrate and having a thin film active layer is called a thin film transistor (TFT). A TFT can be found in a conventional semiconductor IC, for example, as a load transistor of an SRAM.

Furthermore, some of the recent products, for example, driver circuits for optical devices such as liquid crystal displays and image sensors, require a semiconductor IC to be formed on a transparent substrate. TFTs can be found assembled therein, but the ICs must be formed over a wide area and are thereby required that the TFTs are fabricated by a low temperature process. Furthermore, in devices having a plurality of terminals each connected with semiconductor ICs on an insulator substrate, for instance, it is proposed to reduce the mounting density by forming the first layer of the semiconductor IC or the entire semiconductor IC itself monolithically on the same insulator substrate.

Conventionally, the quality of TFTs have been ameliorated by providing a high performance (i.e., a sufficiently high mobility) semiconductor film by improving the crystallinity of an amorphous or a semi-amorphous film, or a microcrystalline film, by irradiating an intense light such as a laser beam thereto or by thermally annealing those films in the temperature range of from 450 to 1200° C. Amorphous TFTs using an amorphous material for the semiconductor film can be certainly fabricated; however, their application field is greatly limited by its inferior operation speed ascribed to too a low mobility of 5 $cm^2$/Vs or lower, about 1 $cm^2$/vs in general, or by its inability of providing a P-channel TFT (PTFT). A TFT having a mobility of 5 $cm^2$/vs or higher is available only after annealing the structure at a temperature in the range of from 450 to 1200° C. A PTFT can be fabricated only after subjecting the film to such annealing treatments.

However, in a process where a high temperature is required, in particular, only strictly selected substrate material can be used. More specifically, a so-called high temperature process which includes high temperature heating in the range of from 900 to 1,200° C. is advantageous, because it allows the use of a high quality film obtainable by thermal oxidation as a gate dielectric, but the usable substrates were confined to those made from expensive materials such as quartz, sapphire, and spinel, and they were not suited as substrates for large area applications.

In contrast to the high temperature process above, substrate materials can be selected from a wider variety in a low temperature process in which a maximum attainable temperature is 750° C. or lower for the entire process inclusive of a crystallization step using laser irradiating. However, there remains a problem of forming insulator films at a low temperature yet at a favorable step coverage and a high throughput. The insulator films can be deposited at a low temperature by sputtering, however, the process is still inferior considering its poor step coverage and insufficient throughput that results therefrom. Also known is depositing a silicon oxide film at a low temperature and high throughput by chemical vapor deposition (CVD) processes such as plasma CVD, low pressure CVD, and normal pressure CVD, in which a gasified organic material containing silicon atoms (referred to hereinafter as organic silane) such as tetraethoxysilane (TEOS) is used as the starting material. The resulting films, however, are rich in carbon atoms and hydrocarbon groups which develop into clusters to provide trap centers. Accordingly, those films are not suited for gate dielectrics because they fail to provide sufficiently high insulating properties and have too high interfacial level density.

The silicon oxide films using organic silane as the starting material as above cannot be used as-deposited for a material such as gate insulator film in which a sufficiently high electric properties are required. Accordingly, they were used only after subjecting them to an oxidation treatment at 700° C. or higher for a long duration of time. Such a heat treatment damages the substrate and impairs the throughput.

SUMMARY OF THE INVENTION

The present invention has been accomplished in light of the circumstances above.

Accordingly, an object of the present invention is to provide an oxide film at a low temperature and at excellent step coverage, yet with improved throughput and ameliorated film quality.

Another object of the present invention is to propose a process for fabricating a TFT, which can be performed at temperatures 700° C. or lower by combining various types of technology referred hereinbefore.

A further another object of the present invention is to overcome the problems above on the conventional gate insulator films, and to thereby provide a TFT capable of yielding superior characteristics with high stability.

It has been now found that the objects above can be accomplished by the embodiments according to the present invention including the following.

A first embodiment of the present invention comprises forming a silicon oxide film by depositing a product obtained through decomposition of an organic silane (or a substituent product of organic silane comprising fluorine substituted for hydrogen, carbon or hydrocarbon radical thereof) by any of the CVD processes such as thermal CVD(chemical vapor deposition), plasma CVD(chemical vapor deposition), photo-CVD(chemical vapor deposition), and photo-plasma CVD(chemical vapor deposition), irradiating a light such as a laser pulse to the deposited film to modify the properties, particularly, by depriving the film of trap centers by removing carbon atoms and hydrocarbon groups from the film. In this manner, a silicon oxide film suitably used as a gate insulator film of a TFT can be obtained. The lasers for use in the present invention are pulsed lasers, and preferred are ultraviolet (UV) light emitting lasers such as excimer lasers, for example, the KrF, ArF, XeCl, and XeF lasers.

A second embodiment according to the present invention comprises forming a silicon oxide film by depositing a product obtained through decomposition of an organic silane by any of the CVD processes, exposing the resulting silicon oxide film to an oxidizing atmosphere comprising oxygen, ozone, nitrogen oxide, etc., and irradiating a UV light at a wavelength of 300 mm or shorter while heating the film to a temperature in the range of from 150 to 400° C., thereby removing the trap centers therefrom. In this manner, a silicon oxide film suitably used as a gate insulator film of a TFT can be obtained.

A further favorable effect can be obtained by combining the aforementioned first and second embodiments according to the present invention. For instance, a silicon oxide film obtained from an organic silane may be exposed to an oxidizing atmosphere and a UV light emitted from a laser at a wavelength of 300 nm may be irradiated thereto while heating the film to a temperature in the range of from 150 to 400° C.

Another embodiment according to the present invention comprises implanting nitrogen ions into a surface portion of an insulator film comprising a silicon oxide film having formed on the surface of a semiconductor to make a silicon oxinitride in the surface portion of the insulator film. The surface of the insulator film can be densified and the dielectric constant thereof be increased by thus surface nitriding the film. In particular, the present embodiment according to the present invention is characterized by implanting nitrogen ions into a surface portion of the silicon oxide film having deposited as the gate insulating film for the TFT (insulated gate field effect transistor), to thereby newly establish a silicon oxinitride film as the gate insulator. The silicon oxinitride film is expressed by $SiO_xN_y$. wherein x is from 0 to 2, preferably from 0.5 to 1.5, and y is from 0 to 4/3, preferably from 0.5 to 1.

The surface nitriding of the silicon oxide film is advantageous, because it densifies the film, increases the dielectric constant of the film to allow deposition of thicker films, and improves the general characteristics of the film as an insulator.

DETAILED DESCRIPTION OF THE PRESENT INVENTION

Figure 1A:
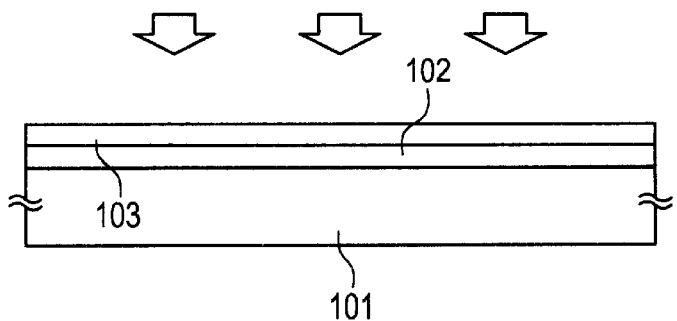
FIGS. 1(A) through 1(E) illustrate a step sequence diagram of a fabrication process for a TFT according to the present invention.
Figure 1B:
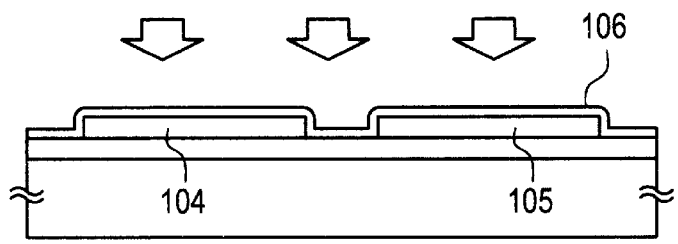

A first embodiment of the present invention comprises forming a silicon oxide film by depositing a product obtained through decomposition of an organic silane by any of the CVD processes such as thermal CVD, plasma CVD, photo-CVD, and photo-plasma CVD, irradiating a pulsed laser beam to the deposited film to modify the properties, particularly, by depriving the film of trap centers by removing carbon atoms and hydrocarbon groups from the film. In this manner, a silicon oxide film suitably used as a gate insulator film of a TFT can be obtained. The lasers for use in the present invention are pulsed lasers, and preferred are UV light emitting lasers such as excimer lasers, for example, the KrF, ArF, XeCl, and XeF lasers.

An intense light preferably is UV or IR (infrared) light. UV light is, as described hereinafter, effective in driving carbon atoms and hydrocarbon groups out of the film. IR light rapidly heats the film to reduce the density of trap centers such as crystal defects and dangling bonds in the film.

The crystallinity of a semiconductor film may be modified, for example, from an amorphous state to a crystalline state by irradiating a laser beam or an IR light. As a matter of course, the crystallinity of the semiconductor film may be improved separately from the modification of the silicon oxide film.

A second embodiment according to the present invention comprises forming a silicon oxide film by depositing a product obtained through decomposition of an organic silane by any of the CVD processes, exposing the resulting silicon oxide film to an oxidizing atmosphere comprising oxygen, ozone, nitrogen oxide, etc., and irradiating a UV light at a wavelength of 300 mm or shorter while heating the film to a temperature in the range of from 150 to 400° C. to thereby remove the trap centers therefrom. In this manner, a silicon oxide film suitably used as a gate insulator film of a TFT can be obtained.

A further favorable effect can be obtained by combining the aforementioned first and second embodiments according to the present invention. For instance, a silicon oxide film obtained from an organic silane may be exposed to an oxidizing atmosphere and a UV light emitted from a laser at a wavelength of 300 nm may be irradiated while heating the film to a temperature in the range of from 150 to 400° C.

In general, organic silanes such as tetraethoxysilane (TEOS), inclusive of those containing fluorine as partial substituents for hydrocarbon groups, ethoxy groups, hydrogen atoms, etc., are liquid under. an ordinary pressure and room temperature. Accordingly, they are heated under reduced pressure if necessary to introduce them into the reaction chamber in a gas phase. When a silicon oxide film is deposited by plasma CVD, a pertinent amount of oxygen is mixed with organic silane and allowed to react using an inert gas such as argon and helium as a carrier gas. When the fabrication is to be performed by low pressure CVD or normal pressure CVD, a mixture of an organic silane and ozone is reacted, if necessary, using the carrier gases above.

In the processes above, the annealing for modifying the crystallinity of the semiconductor film is no longer a step determining the maximum temperature of the entire process, but other factors such as annealing for hydrogenation and annealing the gate oxide film become the determinative ones for the highest temperature of the process. This allows the substrate material to be selected from a wide variety of materials. More specifically, the maximum temperature of the process should be 700° C. or lower, and preferred maximum temperature is 400° C. or lower. As mentioned above, the process according to the present invention can be carried out at a temperature 700° C. or lower. Accordingly, the problems in the conventional processes, i.e., the pattern displacement in large area substrates due to thermal expansion, warping, etc., can be prevented from occurring in the process according to the present invention. For example, the process according to the present invention enables production of multiple TFTs at an extremely high precision from a large area substrate 300 mm×400 mm in size. It can be seen accordingly that the throughput can be increased by adopting the process of the present invention.

Furthermore, soda-lime glass, which had conventionally been regarded as a material unsuited for a substrate of a TFT due to its too low softening point, can be employed for operating thereon a TFT in the process according to the present invention after subjecting soda-lime glass to a proper treatment.

A method for forming a semiconductor device in accordance with the present invention comprises the steps of:

forming a semiconductor film on a substrate;

forming a protective insulating film on said semiconductor film, said protective insulating film being capable of transmitting a light;

irradiating a light to said semiconductor film to improve crystallinity of said semiconductor film;

removing said protective insulating film to expose a surface of said semiconductor film;

forming a silicon oxide film on the exposed surface by chemical vapor deposition using a raw material comprising organic silane;

irradiating a light to at least said silicon oxide film; and forming a gate electrode on said silicon oxide film.

The light irradiated to the semiconductor film is a laser pulse or an infrared light. Also the irradiation of said light to said semiconductor film is continued for 5 seconds to 5 minutes to elevate temperature of said semiconductor film up to 1000 to 1300° C. at a rate of 30 to 300° C./sec, and subsequently the temperature of said semiconductor film is descended at a rate of 30 to 300° C./sec. The light irradiated to at least the silicon oxide film is a laser pulse or an infrared light or a halogen light. Also the irradiation of said light to at least said silicon oxide film is continued for 5 seconds to 5 minutes to elevate temperature of said silicon oxide film up to 1000 to 1300° C. at a rate of 30 to 300° C./sec, and subsequently the temperature of said silicon oxide film is descended at a rate of 30 to 300° C./sec.

A first example of the application of the present invention comprises a peripheral circuit of an active matrix (AM) driven liquid crystal display device (LCD) using an amorphous silicon (a-Si) TFT. In general, an a-SiTFT-AMLCD can be fabricated by forming an a-SiTFT at a temperature 400° C. or lower on a alkali-free glass (such as Corning 7059) substrate. An a-SiTFT is best suited for a switching element from the viewpoint of its high OFF-resistance, however, as mentioned earlier, the operation speed is low and a CMOS cannot be fabricated therefrom. Accordingly, the peripheral circuits had been formed conventionally using single crystal ICs, and the terminals of the matrix had been connected to those of the ICs using a TAB (tape automated bonding) process and the like. Such a mounting process, however, becomes inapplicable with decreasing size of pixels, and, the cost therefor comes to account for a large part of the entire cost for fabricating the entire module.

It was not possible in the conventional process to form the peripheral circuit with the matrix on the same substrate. However, the inconvenience above can be circumvented in the process according to the present invention because a TFT having higher mobility can be formed at a temperature about the same as that necessary for forming an a-SiTFT.

According to a second example of the application of the present invention, a TFT can be formed on, for example, a soda-lime glass, i.e., a material less expensive than an alkali-free glass. In forming a TFT on a soda-lime glass substrate, it is preferred to form the TFT after first forming an insulator coating containing silicon nitride, aluminum oxide, etc., as the principal component on the surface of the glass substrate, and further forming an insulator basecoating film of a material such as silicon oxide and the like. In this manner, the mobile ions such as of sodium present in the glass can be prevented from intruding into the TFT. Additionally, the TFTs for the matrix can be formed with less failure by employing PTFTs rather than using NTFTs. The mobile ions which incidentally intrude into an NTFT from a substrate form a channel to turn the NTFT "ON", however, those which may intrude into a PTFT cannot form any channels.

A third example of the application of the present invention provides a peripheral circuit of a static drive simple matrix LCD. A ferroelectric liquid crystal (FLC) material has a memory effect, and hence, it can provide an image of high contrast ratio even when it is used in a simple matrix LCD. However, the peripheral circuit therefor had been established conventionally by connecting ICs by processes such as TAB in the same manner as that for an a-SiTFT-AMLCD. Similarly, TAB was used for connecting the peripheral circuits for the LCDs operating in a static manner based on the phase transition between a cholesteric phase and a nematic phase. A static drive LCD comprising a combination of a nematic liquid crystal and a ferroelectric polymer is also proposed in, for example, JP-A-61-1152 (the term "JP-A-" as referred herein signifies an "unexamined published Japanese patent application"), but the peripheral circuits are again connected by TAB.

Since the LCDs above are driven in a simple matrix, they can advantageously provide a large image plane using an inexpensive substrate yet with fine resolution. Images with high resolution can be obtained only by narrowing the pitch between the terminals, however, this can be realized at the expense of making the surface mounting of ICs difficult. The process according to the present invention enables the formation of peripheral circuits monolithically on an inexpensive substrate without taking the thermal problems into consideration.

A fourth example of applying the present invention includes a so-called three-dimensional IC which is fabricated by forming a TFT on a semiconductor IC furnished with metal connection.

Apparently, still various types of application are available from the present invention.

The present invention is illustrated in greater detail referring to non-limiting examples below. It should be understood, however, that the present invention is not to be construed as being limited thereto.

EXAMPLE 1

Referring to FIG. 1, a method for forming a TFT (a semiconductor device) according to the present invention is described below. First, a silicon oxide film 102 was deposited as a base oxide film on a Corning 7059 substrate 101 (300 mm×300 mm in size; it may otherwise be 100 mm×100 mm in size) for a thickness of from 100 to 300 nm. The oxide film may be deposited by sputtering in an oxygen atmosphere or using plasma CVD which comprises decomposing TEOS and depositing the resulting product, followed by annealing the film in the temperature range of from 450 to 650° C.

Figure 3A:
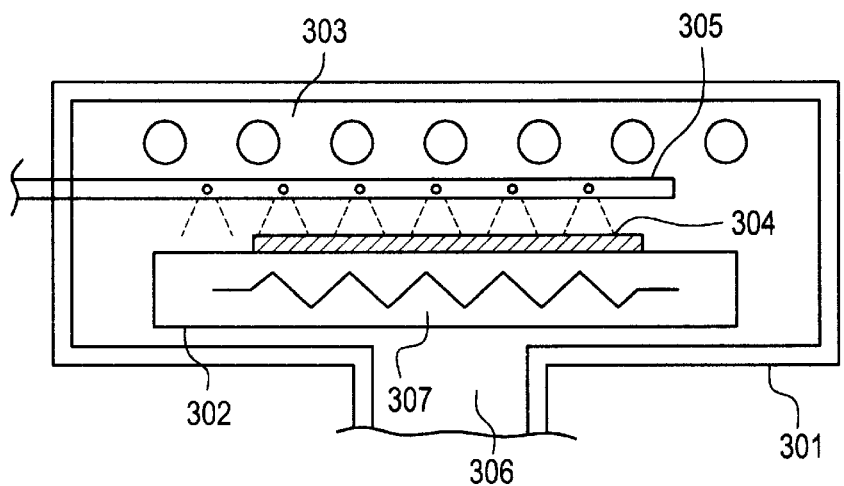
FIGS. 3(A) through 3(C) illustrate schematically drawn diagrams of laser and UV light treatment apparatuses for use in the present invention.
Figure 3B:
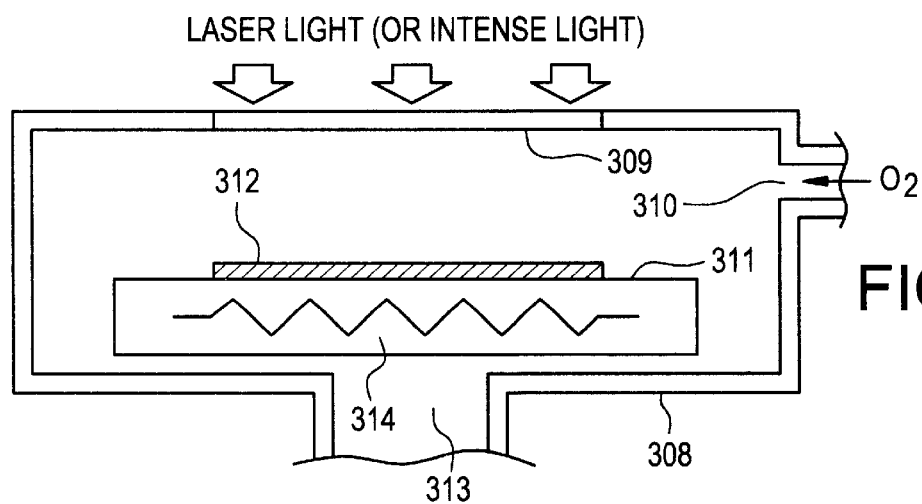

An amorphous silicon film 103 was deposited thereafter by plasma CVD or by LPCVD for a thickness of from 30 to 150 nm, preferably for a thickness of from 50 to 100 nm. Then, a KrF excimer laser operating at a wavelength of 248 nm and a pulse width of 20 nsec was irradiated to the film as shown in FIG. 1(A) to improve the crystallinity of the silicon film 103. The laser irradiation apparatus used herein is illustrated in FIG. 3(B). The crystallinity of the film can be improved by a rapid thermal annealing (RTA) process which comprises irradiating a light as intense as the laser beam. It is also effective to further apply annealing using the above intense light to a silicon film having crystallized by irradiating a laser beam or by heating. An IR light such as a halogen light having a peak at a wavelength of 1.3 $\mu$m is particularly effective for selectively heating the silicon film, because a silicon film preferentially absorbs the light as compared with the glass substrate.

The laser irradiation was performed while heating the sample to a temperature in the range of from 150 to 400° C., and controlling the atmosphere to 10 mTorr or lower. As a result, a film of favorable crystallinity was obtained. The laser beam was irradiated at an energy density of from 200 to 400 mJ/cm$^2$, preferably from 250 to 300 mJ/cm$^2$. The crystallinity of the thus obtained silicon film 103 was studied by Raman scattering spectroscopy to observe a relatively broad peak at 515 cm$^{-1}$ differing from a peak assigned to a single crystal silicon which should be found at 521 cm$^{-1}$.

The silicon layer 103 was patterned into island-like regions to give an NTFT region 104 and a PTFT region 105. A gate oxide film 106 was formed thereon by decomposing TEOS and depositing a silicon oxide film from the decomposed product together with oxygen using RF plasma CVD (chemical vapor deposition) while controlling the temperature of the substrate in the range of from 200 to 500° C., preferably from 200 to 400° C., and more preferably, from 200 to 250° C. TEOS (as an organic silane) and oxygen were supplied at a pressure ratio of 1:1 to 1:3, while controlling the pressure in the range of from 0.05 to 0.5 Torr and the RF power in the range of from 100 to 250 W. This step may otherwise be conducted by low pressure CVD or normal pressure CVD using TEOS and ozone gas as the starting materials, while controlling the substrate temperature in the range of from 150 to 400° C., preferably from 200 to 250° C.

The resulting silicon oxide film was thermally annealed at 400 to 700° C. in an atmosphere comprising a nitrogen gas.

The as-deposited and annealed oxide film cannot be used as it is for a gate oxide film, because it contains a large amount of hydrocarbon groups which function as trap centers. In this context, a laser beam was irradiated to at least the silicon oxide film (the gate oxide film) using an apparatus illustrated in FIG. 3(B) after the thermally annealing of the silicon oxide film to reduce the number of trap centers in the oxide film.

Referring to FIG. 3(B), the apparatus comprises a chamber 308 having provided with an oxygen gas inlet 310, an exhaust port 313, and a quartz window 309, and a holder 311 equipped with a heater 314 is placed therein to mount thereon a sample 312. A laser beam or an intense light is irradiated to the sample through the window 309. The irradiation of an intense light reduces the trap centers in the oxide film in number, and, at the same time, densifies the silicon oxide film and modifies the interface between the semiconductor and the silicon oxide film.

This step was performed as follows. First, the chamber was evacuated to a sufficiently high vacuum, and oxygen, ozone, or nitrogen oxide (e.g., $NO_2$, NO, and $N_2O$) was introduced therein to initiate the irradiation of a laser beam or an intense light. The irradiation was conducted under a reduced pressure of 10 Torr or lower, or under an oxidizing atmosphere of atmospheric pressure. Generally, a KrF laser beam is used as the laser beam. An intense light in general is an incoherent UV (ultraviolet light) light. When a laser is used, it should be operated for 10 shots at an energy density of from 250 to 300 mJ/cm$^2$. The temperature during the irradiation should be maintained preferably in the temperature range of from 150 to 400° C., and representatively, at 300° C. The application of RTO (rapid thermal oxidation) using an IR (infrared) light as the intense light, a halogen light at a wavelength of 1.3 $\mu$m, for instance, is also useful. The RTO process comprises instantaneous heating of the oxide film using an IR light to reduce the number of trap centers in the film. The irradiated surface is rapidly heated to a temperature in the range of from 1000 to 1300° C. preferably from 1,000 to 1,200° C. to modify the characteristics of the interface between the semiconductor and the gate oxide film. The interfacial level density of the gate oxide film can be reduced to 10$^{11}$ cm$^{-2}$ or lower by annealing. Also, in case of the RTO, a light may be irradiated to at least the gate oxide film for 5 seconds to 5 minutes to elevate temperature of the gate oxide film up to 1000 to 1300° C. at a rate of 30 to 300° C./sec followed by descending the temperature of the gate oxide film at a rate of 30 to 300° C./sec.

The resulting silicon oxide film was then thermally annealed at 400 to 700° C. in an atmosphere comprising a gas selected from the group consisting of nitrogen and oxygen.

Figure 1C:
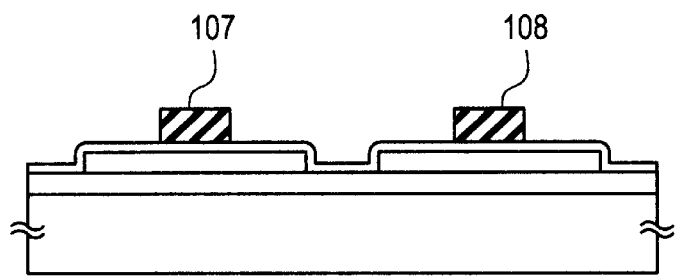

An aluminum film was deposited at a thickness of from 200 nm to 5 $\mu$m using electron beam vapor deposition and was subjected to patterning to obtain gate electrodes 107 and 108 on the gate oxide film as shown in FIG. 1(C). The aluminum film was deposited by electron beam deposition to obtain a film having high reflectance, because it should resist later to a laser irradiation. Thus was obtained an aluminum film so smooth that no grains were observed through an optical microscope. The grains as observed through an electron microscope was 200 nm or less in size. These grains must be controlled to a size smaller than the wavelength of the laser to be used in the process.

Impurities were implanted into the island-like silicon film of each of the TFTs by irradiating an ion to the island-like silicon film or by ion doping process in a self-aligned manner using the gate electrode as the mask. More specifically, phosphorus was first implanted at a dose of $2 \times 10^{15}$ to $8 \times 10^{15}$ cm$^{-2}$ using phosphine (PH$_3$) gas as the doping gas, and after covering the island-like region 104 alone with a photoresist, boron was introduced at a dose of $4 \times 10^{15}$ to $10 \times 10^{15}$ cm$^{-2}$ into solely the island-like region 105 using diborane (B$_2$H$_6$) as the doping gas. In this manner, boron was incorporated into the film at a dose higher than that of phosphorus.

Figure 1D:
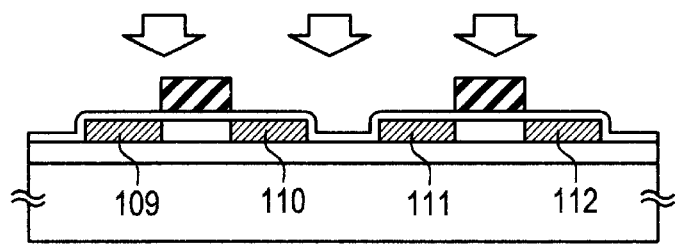

Subsequently, a light such as a KrF laser beam 248 nm in wavelength was irradiated to the resulting structure at a pulse width of 20 nm with the gate electrode as a mask as illustrated in FIG. 1(D) to recover the crystallinity of the damaged impurity-doped regions. The apparatus used for this laser irradiation step is shown in FIG. 3(B). The laser was operated at an energy density in the range of from 200 to 400 mJ/cm$^2$, preferably in the range of from 250 to 300 mJ/cm$^2$. The sample in this case was not heated. Thus were obtained N-type impurity (phosphorus) regions 109 and 110, and P-type impurity (boron) regions 111 and 112. The sheet resistance of these regions was found to be in the range of from 200 to 800 Ω/sq. A 300 nm thick silicon oxide film was deposited thereon as the interlayer insulator 113 using TEOS as the starting material in combination with oxygen in case of employing plasma CVD, or with ozone in case of carrying out low pressure CVD or normal pressure CVD. The temperature of the substrate was maintained throughout this step in the temperature range of from 150 to 400° C., preferably from 200 to 300° C.

Figure 1E:
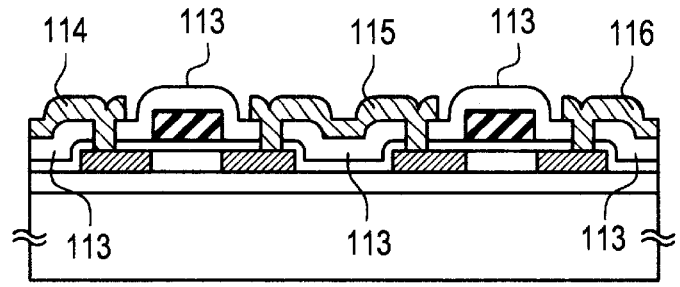

Aluminum connections 114 to 116 were then formed after perforating contact holes in the source/drain of the TFTs. FIG. 1(E) shows an inverter circuit comprising an NTFT on the left hand side and a PTFT on the other side. The mobility for the TFTs was found to be from 50 to 100 cm$^2$/Vs for the NTFT and from 30 to 100 cm$^2$/Vs for the PTFT. Since the maximum process temperature in the present example is 400° C. or lower, no shrinking nor warping occurs on an alkali-free glass substrate such as Corning 7059 substrate. It follows that a large area display or a driver circuit therefor can be favorably fabricated from the above substrate, because substantially no displacement occurs on the patterns of the substrates as large in size as above.

EXAMPLE 2

Referring to FIG. 2, a process for fabricating a TFT on a soda-lime glass substrate to provide an AMLCD element according to the present invention is described below. First, a silicon nitride film 202 was deposited as a blocking layer over the entire surface of a substrate 201 made from a soda-lime glass plate 1.1 mm in thickness and 300 mm×400 mm in size. Because a soda-lime glass is abundant in sodium, the silicon nitride film 202 as the blocking layer was deposited by plasma CVD process at a thickness of from 5 to 50 nm, preferably from 5 to 20 nm, to thereby prevent sodium diffusion from occurring in the TFT. This technology of providing a blocking layer by coating the substrate with a silicon nitride or aluminum oxide film is disclosed in Japanese patent application Nos. Hei-3-238710 and Hei-3-238714 filed by the present applicants.

Subsequent to the formation of a base oxide (silicon oxide) layer 203, a silicon film 204 was deposited at a thickness of from 30 to 150 nm, preferably from 30 to 50 nm by LPCVD or plasma CVD. The film was subjected to dehydrogenation at 400° C. for a duration of one hour and then patterned to form island-like semiconductor regions as the active layer of the TFT. A gate insulator film 205 was deposited for a thickness of from 70 to 120 nm, typically for a thickness of 100 nm, in an oxygen atmosphere by plasma CVD using TEOS as the starting material. The substrate was maintained at a temperature of 400° C. or lower, preferably in the range of from 200 to 350° C., to prevent shrinking or warping from occurring on the substrate. The resulting silicon oxide film, however, contains numerous hydrocarbon groups and many trap centers. More specifically, for example, the interfacial level density was found to be $10^{12}$ cm$^{-2}$ or more, a value far beyond the allowable density for a gate insulator film.

Figure 2A:
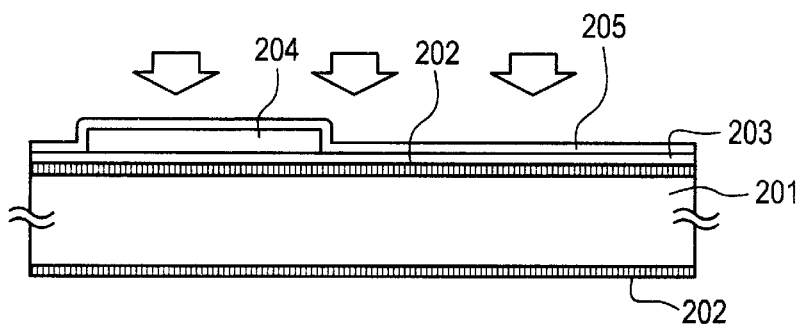
FIGS. 2(A) through 2(E) illustrate a step sequence diagram of another fabrication process for a TFT according to the present invention.

Accordingly, a laser beam emitted from a KrF laser or a light having an intensity equivalent thereto was irradiated to the gate insulator film 205 and the island-like semiconductor regions 204 as shown in FIG. 2(A) to improve the crystallinity of the island-like semiconductor regions and to ameliorate the characteristics of the gate insulator film 205 by reducing the number of the trap centers therein. That is, the present step encompasses both the crystallization of the silicon film and the modification of the gate oxide film, which were conducted separately in two steps in the foregoing Example 1. If an intense light were to be employed, annealing using an IR light, a halogen light 1.3 $\mu$m in wavelength, for instance, is particularly effective in this case.

The laser irradiation in this step is preferably performed in the presence of oxygen in excess, under a reduced pressure of 10 Torr or lower. A reduced pressure is preferred because the carbon atoms present in the oxide film may readily be desorbed. The oxygen partial pressure was controlled, for example, in the range of from 1 to 10 Torr. The laser beam was irradiated at an energy density of from 250 to 300 mJ/cm$^2$, and was shot for 10 times. Preferably, the temperature is maintained in the range of from 150 to 400° C., and representatively, at 300° C. The laser irradiation was conducted using an apparatus illustrated in FIG. 3(B). A silicon film 204 improved in crystallinity and a gate oxide film reduced in interfacial level density to $10^{11}$ cm$^{-1}$ or lower were obtained as a result.

Figure 2B:
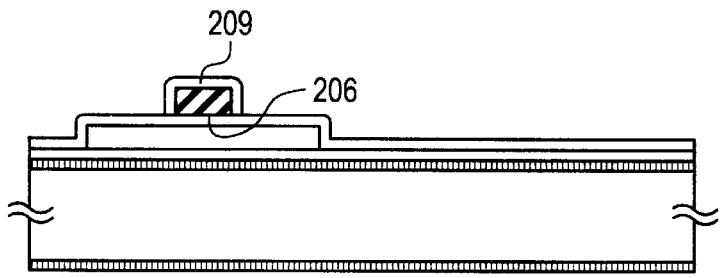
Figure 2C:
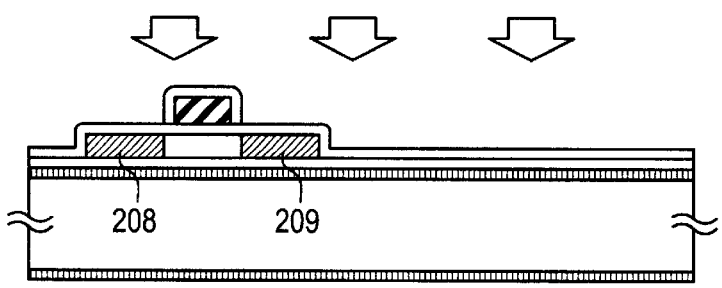
Figure 2D:
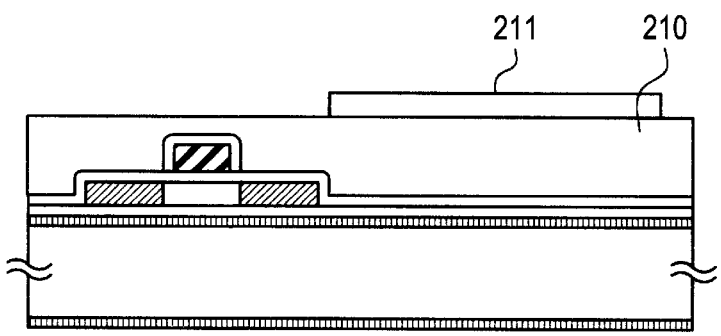
Figure 2E:
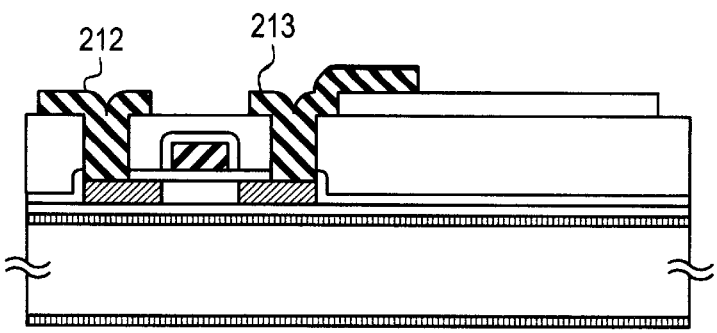

After forming an aluminum gate electrode 208 in the same manner as in Example 1, the entire structure together with the substrate was immersed into an electrolytic solution as an anode, and current was applied thereto to form an anodic oxide coating 209 for a thickness of 206 nm on the surface of the aluminum connection inclusive of the gate electrode. The technique of anodic oxidation is disclosed in Japanese patent application Nos. Hei-4-30220, Hei-4-38637, and Hei-4-54322 filed by the present applicants. The structure obtained after this step is shown in FIG. 2(B). Otherwise, a negative voltage can be reversely applied to the structure upon completion of the anodic oxidation; for example, a voltage in the range of from −100 to −200 V may be applied for a duration of from 0.1 to 5 hours, while maintaining the substrate preferably in the range of from 100 to 250° C., representatively at 150° C. By incorporating this additional step, the mobile ions inside silicon oxide or at the boundary between silicon oxide and silicon are attracted to the aluminum gate electrode. This technique of applying a negative voltage to the gate electrode after or during anodic oxidation is disclosed in Japanese patent application No. Hei-4-1155-3 filed by the present applicants on Apr. 7, 1992.

Boron as a P-type impurity was then implanted into the silicon layer in a self-aligned manner by ion doping to form source/drain 208 and 209 of the TFT, and a KrF laser beam having set at an energy density of from 250 to 300 mJ/cm$^2$ was irradiated thereto to recover the crystallinity of the silicon film having damaged by the ion doping process. The sheet resistance of the source/drain after the laser irradiation was found to be in the range of from 300 to 800 Ω/sq. Annealing by irradiating an intense light, preferably an IR light, is useful in this step.

A pixel contact 211 was formed using an ITO after forming an interlayer insulator 210 using polyimide. Contact holes were perforated thereafter to establish contacts 212 and 213 in the source/drain regions of the TFTs using a chromium/aluminum multilayered film composed of a 20 to 200 nm thick, representatively 100 nm thick, lower chromium film and a 100 to 2,000 nm thick, representatively 500 nm thick, upper aluminum film. The multilayers are preferably deposited continuously using sputtering. One 213 of the thus obtained two contacts was connected to the ITO. Finally, the structure was annealed in hydrogen at 200 to 300° C. for a duration of 2 hours to complete the hydrogenation of silicon. Thus was obtained a complete TFT. A plurality of such TFTs having fabricated simultaneously were assembled in a matrix to obtain an AMLCD device.

EXAMPLE 3

Referring to FIG. 1, a process for fabricating another TFT according to the present invention is described below. First, a silicon oxide film 102 was deposited as a base oxide film on a Corning 7059 substrate 101 for a thickness of from 100 to 300 nm. An amorphous silicon film 103 was deposited thereafter by plasma CVD or by LPCVD for a thickness of from 30 to 150 nm, preferably for a thickness of from 50 to 100 nm. Then, a KrF excimer laser operating at a wavelength of 248 nm and a pulse width of 20 nsec was irradiated to the film as shown in FIG. 1(A) to improve the crystallinity of the silicon film 103. The crystallinity of the film can be improved by irradiating a light as intense as the laser beam to heat the silicon film to a temperature range of from 1,000 to 1,200° C.

The silicon layer 103 was patterned into island-like regions to give an NTFT region 104 and a PTFT region 105. A gate oxide film 106 was formed thereon by decomposing TEOS (organic silane) and depositing a silicon oxide film from the decomposed product together with oxygen using RF plasma CVD. The as-deposited oxide film cannot be used as it is for a gate oxide film, because it contains a large amount of hydrocarbon groups which function as trap centers. In this context, a laser beam was irradiated together with an intense light using an apparatus illustrated in FIG. 3(A) to reduce the number of trap centers in the oxide film. This step also densities the oxide film. The intense light may be a UV (ultraviolet) light or an IR light which accompanies rapid heating. Referring to FIG. 3(A), the apparatus comprises a chamber 301 having provided with an oxygen gas inlet 305 which provides an oxygen gas shower, an exhaust port 306, and a UV lamp 303; a holder 302 equipped with a heater 307 is placed therein to mount a sample 304 thereon. A UV (ultraviolet) light having a wavelength of 300 nm or shorter is irradiated to at least the gate oxide film to effect the annealing. A 40-W UV lamp which emits a light having a spectrum with a peak at a wavelength of approximately 250 nm was used in this apparatus.

In the chamber, a shower of oxygen, ozone, or nitrogen oxide (e.g., $NO_2$, NO, and $N_2O$) was blown against the sample. No particular step of evacuating the chamber to vacuum was carried out. Accordingly, UV light irradiation was effected under atmospheric pressure. The UV light causes the oxidizing gas to undergo a photochemical reaction to generate active oxygen or ozone. These active species then react with carbon, hydrocarbons, etc., inside the silicon oxide film to decrease the concentration of the carbon atoms inside the film to a sufficiently low level. Preferably, the sample is maintained in a temperature range of from 150 to 400° C., representatively at 300° C. during the reaction. As a result, the interfacial level density was reduced to $10^{11}$ cm$^{-2}$ or lower.

Figure 3C:
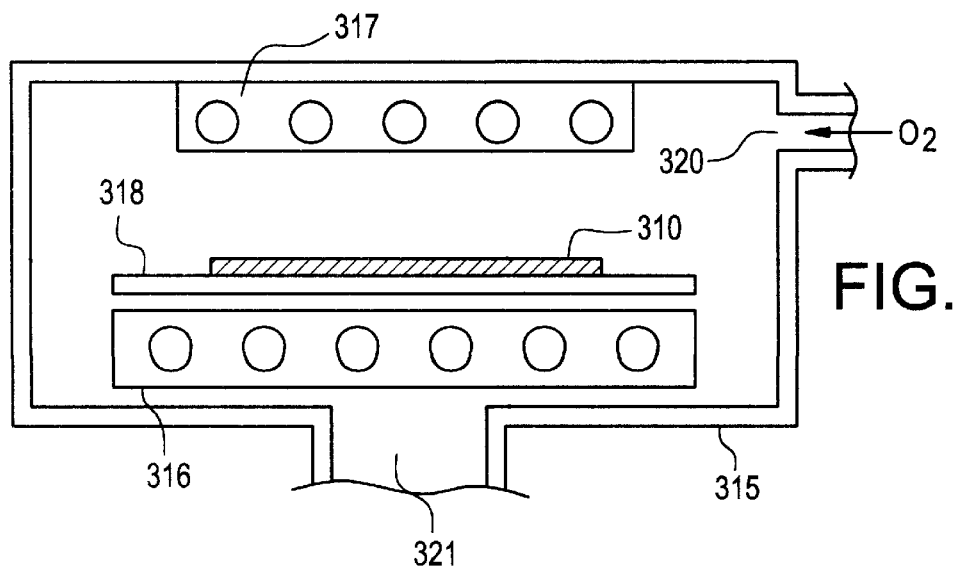

An apparatus shown in FIG. 3(C) can be used in the place of the one shown in FIG. 3(A). Referring to FIG. 3(C), the apparatus comprises a chamber 315 having provided with an oxygen gas inlet 320, an exhaust port 321, and a UV lamp 317; a holder 318 is placed therein to mount a sample 319 thereon. In this apparatus, an oxidizing gas such as oxygen, ozone, and a nitrogen oxide is introduced after evacuating the chamber to a sufficiently high vacuum.

An aluminum film was deposited at a thickness of from 200 nm to 5 μm using electron beam vapor deposition and was subjected to patterning to obtain gate electrodes 107 and 108 on the gate oxide film as shown in FIG. 1(C). Impurities were implanted into the island-like silicon film of each of the TFTs by ion doping process in a self-aligned manner using the gate electrodes as the masks. A KrF laser beam 248 nm in wavelength was irradiated to the resulting structure at a pulse width of 20 nm as illustrated in FIG. 1(D) to recover the crystallinity of the damaged impurity-doped regions. Thus were obtained N-type impurity (phosphorus) regions 109 and 110, and P-type impurity (boron) regions 111 and 112. The sheet resistance of these regions was found to be in the range of from 200 to 800 Ω/sq. A 300 nm thick silicon oxide film was deposited thereon as the interlayer insulator 113 using TEOS as the starting material.

Aluminum connections 114 to 116 were then formed after perforating contact holes in the source/drain of the TFTs. FIG. 1(E) shows an inverter circuit comprising an NTFT on the left hand side and a PTFT on the other side. The mobility for the TFTs was found to be from 50 to 100 cm$^2$/Vs for the NTFT and from 30 to 100 cm$^2$/Vs for the PTFT. Thus was obtained a five-digit shift resister, and its driving at 10 MHz or higher was confirmed at a drain voltage of 20 V.

EXAMPLE 4

Referring to FIG. 7, a process for fabricating a TFT according to the present invention is described below. First, a silicon oxide film 102 was deposited as a base oxide film on a Corning 7059 substrate 101 (300 mm×300 mm in size, which may otherwise be 100 mm×100 mm in size) for a thickness of from 100 to 300 nm. The oxide film may be deposited by sputtering in an oxygen atmosphere or using plasma CVD which comprises decomposing TEOS and depositing the resulting product, followed by annealing the film in the temperature range of from 450 to 650° C.

Figure 7A:
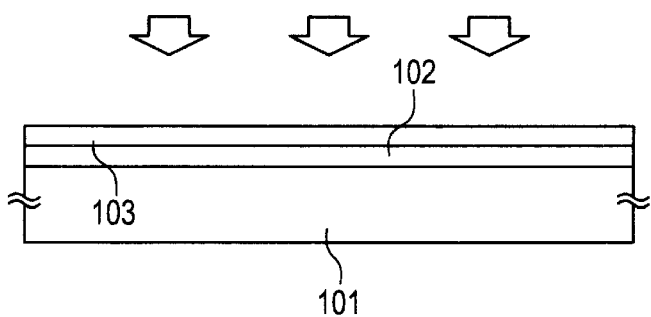
FIGS. 7(A) through 7(E) illustrate a step sequence diagram of another fabrication process for a TFT according to the present invention.
Figure 7B:
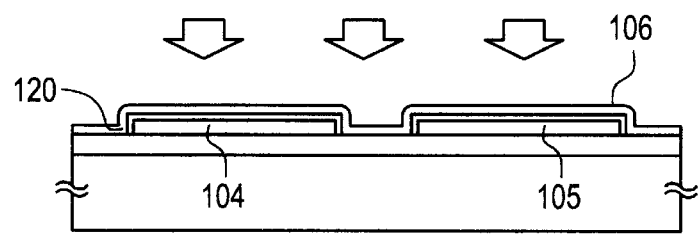

An amorphous silicon film 103 was deposited thereafter by plasma CVD or by LPCVD for a thickness of from 30 to 150 nm, preferably for a thickness of from 50 to 100 nm. Then, a KrF excimer laser operating at a wavelength of 248 nm and a pulse width of 20 nsec was irradiated to the film as shown in FIG. 7(A) to improve the crystallinity of the silicon film 103. The laser irradiation apparatus used herein is illustrated in FIG. 3(B). The crystallinity of the film can be improved by a rapid thermal annealing (RTA) process which comprises irradiating a light as intense as the laser beam. It is also effective to further apply annealing using the above intense light to a silicon film having crystallized by irradiating a laser beam or by heating. An IR light such as a halogen light having a peak at a wavelength of 1.3 μm is particularly effective for selectively heating the silicon film, because, as compared with the glass substrate, a silicon film preferentially absorbs the light.

The laser irradiation was performed while heating the sample to a temperature in the range of from 150 to 400° C., and controlling the atmosphere to 10 mTorr or lower. As a result, a film of favorable crystallinity was obtained. The laser beam was irradiated at an energy density of from 200 to 400 mJ/cm$^2$, preferably from 250 to 300 mJ/cm$^2$. The crystallinity of the thus obtained silicon film 103 was studied by Raman scattering spectroscopy to observe a relatively broad peak at 515 cm$^{-1}$ differing from a peak assigned to a single crystal silicon which should be found at 521 cm$^{-1}$.

The silicon layer 103 was patterned into island-like regions to give an NTFT region 104 and a PTFT region 105. The surface portion of the island-like NTFT and PTFT regions 104 and 105 was oxidized at a temperature range of from 500 to 700° C. in an oxide gas to form a 20 to 200 Å thick first silicon oxide layer 120. The oxide gas may be, for example, a 99.9% or higher purity dry oxygen. A gate oxide film 106 was formed on the first silicon oxide layer as a second silicon oxide layer by decomposing TEOS (organic silane) and depositing a silicon oxide film from the decomposed product together with oxygen using RF plasma CVD (chemical vapor deposition) while controlling the temperature of the substrate in the range of, from 200 to 500° C., preferably from 200 to 400° C., and more preferably, from 200 to 250° C. TEOS and oxygen were supplied at a pressure ratio of 1:1 to 1:3, while controlling the pressure in the range of from 0.05 to 0.5 Torr and the RF power in the range of from 100 to 250 W. This step may otherwise be conducted by low pressure CVD or normal pressure CVD using TEOS and ozone gas as the starting materials, while controlling the substrate temperature in the range of 150 to 400° C., preferably from 200 to 250° C.

The resulting silicon oxide film was thermally annealed at 400 to 700° C. in a nitrogen gas atmosphere.

The as-deposited and annealed oxide film cannot be used as it is for a gate oxide film, because it contains a large amount of hydrocarbon groups which function as trap centers. In this context, a laser beam was irradiated to at least the first and second silicon oxide layers using an apparatus illustrated in FIG. 3(B) to reduce the number of trap centers in the oxide film. A light may be irradiated to at least the first and second silicon oxide layers for 5 seconds to 5 minutes to elevate temperature of said first and second oxide layers up to 1000 to 1300° C. at a rate of 30 top 300° C./sec. followed by descending the temperature of said first and second silicon oxide layers at a rate of 30 to 300° C./sec. Referring to FIG. 3(B), the apparatus comprises a chamber 308 having provided with an oxygen gas inlet 310, an exhaust port 313, and a quartz window 309; a holder 311 equipped with a heater 314 is placed therein to mount thereon a sample 312. A laser beam or an intense light is irradiated to the sample through the window 309. The irradiation of an intense light reduces the number of the trap centers in the oxide film, and, at the same time, densifies the silicon oxide film and modifies the interface between the semiconductor and the silicon oxide film.

This step was performed as follows. First, the chamber was evacuated to a sufficiently high vacuum, and oxygen, ozone, or nitrogen oxide (e.g., $NO_2$, NO, and $N_2O$) was introduced therein to initiate the irradiation of a laser beam or an intense light. The irradiation was conducted under a reduced pressure of 10 Torr or lower, or under an oxidizing atmosphere of atmospheric pressure. Generally, a KrF laser beam is used as the laser beam. An intense light in general is an incoherent UV light. When a laser is used, it should be operated for 10 shots at an energy density of from 250 to 300 mJ/cm$^2$. The temperature during the irradiation should be maintained preferably in the temperature range of from 150 to 400° C., and representatively, at 300° C. The application of RTO (rapid thermal oxidation) using an IR light as the intense light, a halogen light at a wavelength of 1.3 μm, for instance, is also useful. The RTO process comprises instantaneous heating of the oxide film using an IR light to reduce the number of trap centers in the film. The irradiated surface is rapidly heated to a temperature in the range of from 1,000 to 1,200° C. to modify the characteristics of the interface between the semiconductor and the gate oxide film. The interfacial level density of the gate oxide film can be reduced to $10^{11}$ cm$^{-2}$ or lower by annealing.

The resulting silicon oxide film was then thermally annealed at 400 to 700° C. in a nitrogen or oxygen gas atmosphere.

Figure 7C:
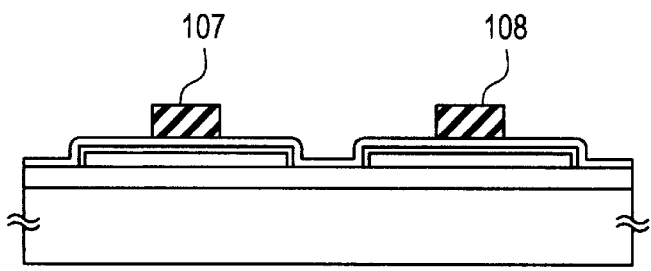

An aluminum film was deposited at a thickness of from 200 nm to 5 μm using electron beam vapor deposition and was subjected to patterning to obtain gate electrodes 107 and 108 as shown in FIG. 7(C). The aluminum film was deposited by electron beam deposition to obtain a film having high reflectance, because it should resist later to laser irradiation. Thus was obtained an aluminum film so smooth that no grains were observed through an optical microscope. The grains as observed through an electron microscope was 200 nm or less in size. These grains must be controlled to a size smaller than the wavelength of the laser to be used in the process.

Impurities were implanted into the island-like silicon film of each of the TFTs by ion doping process in a self-aligned manner using the gate electrodes as the masks. More specifically, phosphorus was first implanted at a dose of $2 \times 10^{15}$ to $8 \times 10^{15}$ cm$^{-2}$ using phosphine ($PH_3$) gas as the doping gas, and after covering the island-like region 104 alone with a photoresist, boron was introduced at a dose of $4 \times 10^{15}$ to $10 \times 10^{15}$ cm$^{-2}$ into solely the island-like region 105 using diborane ($B_2H_6$) as the doping gas. In this manner, boron was incorporated into the film at a dose higher than that of phosphorus.

Figure 7D:
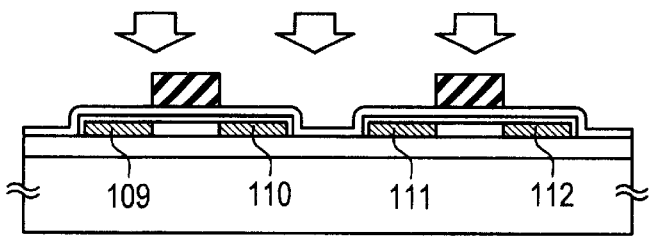

A KrF laser beam 248 nm in wavelength was irradiated to the resulting structure at a pulse width of 20 nm as illustrated in FIG. 7(D) to recover the crystallinity of the damaged impurity-doped regions. The apparatus used for this laser irradiation step is shown in FIG. 3(B). The laser was operated at an energy density in the range of from 200 to 400 mJ/cm$^2$, preferably in the range of from 250 to 300 mJ/cm$^2$. The sample in this case was not heated. Thus were obtained N-type impurity (phosphorus) regions 109 and 110, and P-type impurity (boron) regions 111 and 112. The sheet resistance of these regions was found to be in the range of from 200 to 800 Ω/sq. A 300 nm thick silicon oxide film was deposited thereon as the interlayer insulator 113 using TEOS as the starting material in combination with oxygen in case of employing plasma CVD, or with ozone in case of carrying out low pressure CVD or normal pressure CVD. The temperature of the substrate was maintained throughout this step in the temperature range of from 150 to 400° C., preferably from 200 to 300° C.

Figure 7E:
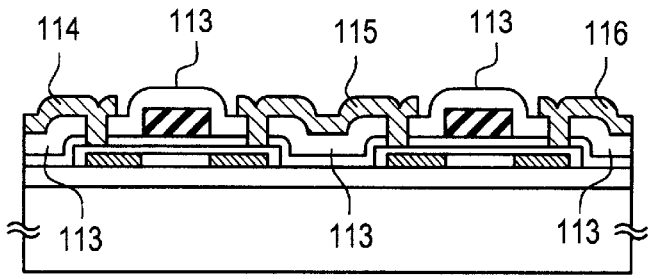

Aluminum connections 114 to 116 were then formed after perforating contact holes in the source/drain of the TFTs. FIG. 7(E) shows an inverter circuit comprising an NTFT on the left hand side and a PTFT on the other side. The mobility for the TFTs was found to be from 50 to 100 $cm^2/Vs$ for the NTFT and from 30 to 100 $cm^2/Vs$ for the PTFT. Since the maximum process temperature in the present example is 400° C. or lower, no shrinking nor warping occurs on an alkali-free glass substrate such as Corning 7059 substrate. It follows that a large area display or a driver circuit therefor can be favorably fabricated from the above substrate, because substantially no displacement occurs on the patterns of the substrates as large in size as the one described above.

EXAMPLE 5

An example of forming an NTFT (insulated gate field effect transistor) on the pixel electrode portion of an AMLCD device is described below. As a matter of course, the basic structure is the same for various types of modifications such as a PTFT having formed in the place of the NTFT and the TFTs having formed for the peripheral circuit of a liquid crystal display device. Furthermore, a structure similar to that in the present example can be used as the basic structure of the TFTs for image sensors and other types of ICs.

Referring to FIGS. 4 and 5, the fabrication process for the present example is described. Referring to FIG. 4, a 2,000 Å thick silicon oxide film (not shown in the figure) was deposited by sputtering on a glass substrate 11 as a base coating. According to a known technology, a 1,000 Å thick amorphous silicon film 12 was deposited thereon by plasma CVD. A mask 401 provided with a portion 14 to expose the underlying amorphous silicon film, was then formed using silicon oxide at a thickness of 500 Å.

Subsequently, a 20 Å thick nickel silicide film was deposited by sputtering. This film is incorporated to accelerate the crystallization of the underlying amorphous silicon film 12 with the constituent element nickel. This film in general is deposited to a thickness of from 5 to 200 Å. Nickel was used in this case for accelerating the crystallization of the amorphous silicon film, but any element belonging to Group VIII of the periodic table, such as iron (Fe), cobalt (Co), ruthenium (Ru), rhodium (Rh), palladium (Pd), osmium (Os), iridium (Ir), and platinum (Pt), may be used in the place of nickel. Also usable are those belonging to Group IIId of the periodic table, and specifically mentioned are scandium (Sc), titanium (Ti), vanadium (V), chromium (Cr), manganese (Mn), copper (Cu), and zinc (Zn). Gold (Au) and silver (Ag) are also members useful in the present invention. Particularly preferred among them are Ni, Pd, Cu, and Au. Those elements may be incorporated in the film by any means, such as depositing a thin film on the upper or the lower surface of the amorphous silicon film by using sputtering, plasma treatment which comprises sputtering using a plasma, CVD, and vapor deposition, and directly introducing the elements into the amorphous silicon film by using ion implantation.

The silicon oxide film 401 mask was removed thereafter to leave nickel silicide film selectively on the surface portion 14 of the amorphous silicon film 12. Then, nickel in the surface portion 14 of the amorphous silicon film was alloydized by irradiating an IR light, for example, at a wavelength of 1.3 $\mu$m, to instantaneously heat the selected surface portion of the amorphous silicon film. In this manner, a nickel silicide portion can be formed. This step is useful for effective crystallization, because it facilitates nickel diffusion in the later step of annealing for the crystallization.

An annealing for 4 hours at 550° C. in an inert gas atmosphere was effected thereafter. The heat treatment allows the amorphous silicon film 12 to crystallize. During this step, the crystallization occurs along a direction parallel to the substrate as indicated with arrows 10 in the figure to give acicular or columnar crystals. The crystal growth occurs over a distance of 40 $\mu$m or longer. The crystallization process need not always follow the one described above, and a laser beam may be irradiated or a thermal annealing at 600° C. for a duration of 24 hours or longer may be performed according to known techniques. Furthermore, the film may be left amorphous (see FIG. 4(B) for reference).

Then, an active layer is established by isolating the elements. The active layer herein refers to the region in which source/drain regions and channel forming regions are to be formed. Preferably the nickel-containing region 14 into which nickel was introduced in the form of nickel silicide and the final point of the crystal growth (i.e., the left end of the silicon film 12 in the figure) are removed by etching, because these portions contain nickel in an excessively high concentration. The remaining intermediate portion having grown parallel to the substrate can be favorably used as the active layer.

Subsequent to the step above, a 1,500 Å thick silicon oxide film 13 was formed for a gate insulator film. The incorporation of chlorine atoms into this silicon oxide film is preferred, because the film then exerts gettering effect on impurity ions.

Figure 4A:
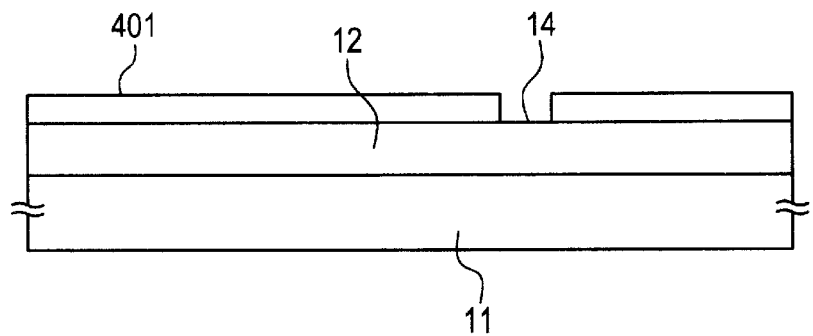
FIGS. 4(A) through 4(D) illustrate a step sequence diagram of a fabrication process for a TFT according to a present example.
Figure 4B:
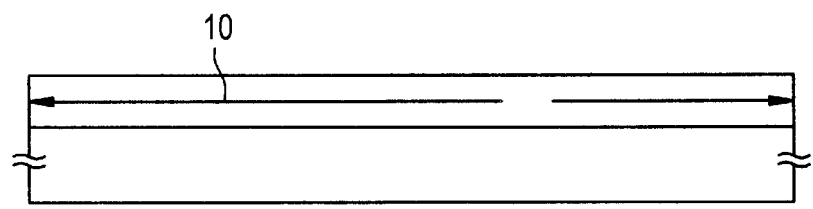
Figure 4C:
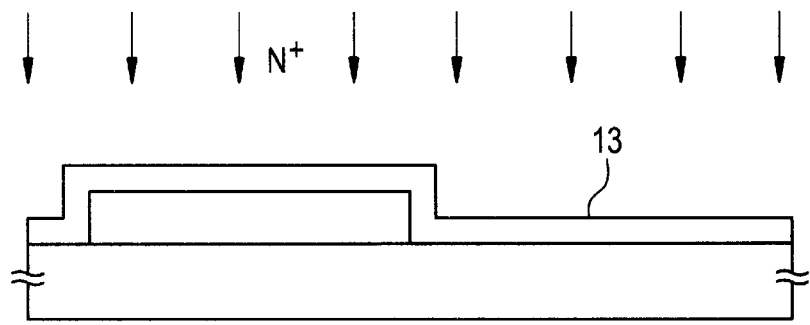

Referring to FIG. 4(C), nitrogen ions are implanted into the silicon oxide film 13. A silicon oxynitride surface forms on the surface of the silicon oxide film in this step. However, intrusion of nitrogen ions into the active layer through the silicon oxide film 13 must be avoided. The key in this step is to nitride only the vicinity of the surface of the silicon oxide film 13.

A silicon oxynitride film 13 having a dielectric constant of from 4 to 6 results by the implantation of the nitrogen ions in the step above. The dielectric constant of from 4 to 6 is higher as compared to that of 3.8 to 4.0 of the silicon oxide film. Moreover, the film itself can be densified. As a result, problems such as of impurity ion (sodium ion) transport within the gate insulator film, leakage ascribed to pinholes, and withstand voltage can be solved. Furthermore, a thicker gate insulator film can be established because the dielectric constant therefor is higher than that for the silicon oxide film. This advantage favors solving the problems of leak current and pinholes.

Also preferred is to apply photo-annealing by irradiating an infrared ray to the silicon oxide gate insulator film 13 after implanting nitrogen ions into the silicon oxide gate insulator film 13. Particularly preferred is the use of a near IR light about 1 to 2 $\mu$m in wavelength, because the defects and the dangling bonds in the silicon film 12 can be eliminated without heating the glass substrate, and because the interfacial level density between the gate insulator film 13 and the silicon film 12 can be lowered at the same time. These greatly contribute to the improvement of the TFT characteristics.

Figure 4D:
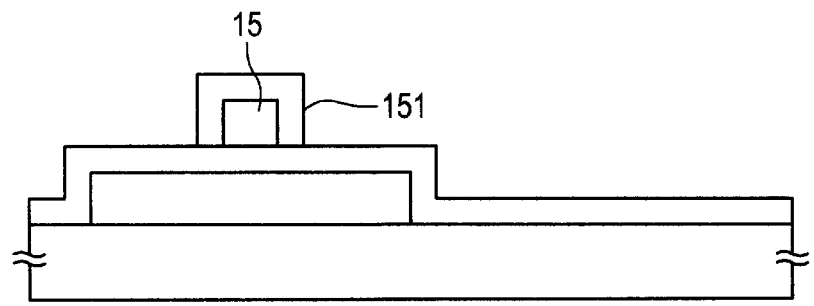

A gate contact 15 was formed by patterning a 6,000 Å thick aluminum film having formed on the gate insulator film 13. The surface of the gate contact 15 was oxidized by anodic oxidation to form an oxide layer 151 on the surface of the gate contact 15. This oxide layer 151 is used in the later step of ion implantation to form an offset gate structure, and the thickness thereof determines the offset gate length. Accordingly, the oxide layer was formed at a thickness of 2,000 Å in this example. The resulting structure is shown in FIG. 4(D).

The gate contact in the present example can be formed using a known material based on silicon.

Figure 5A:
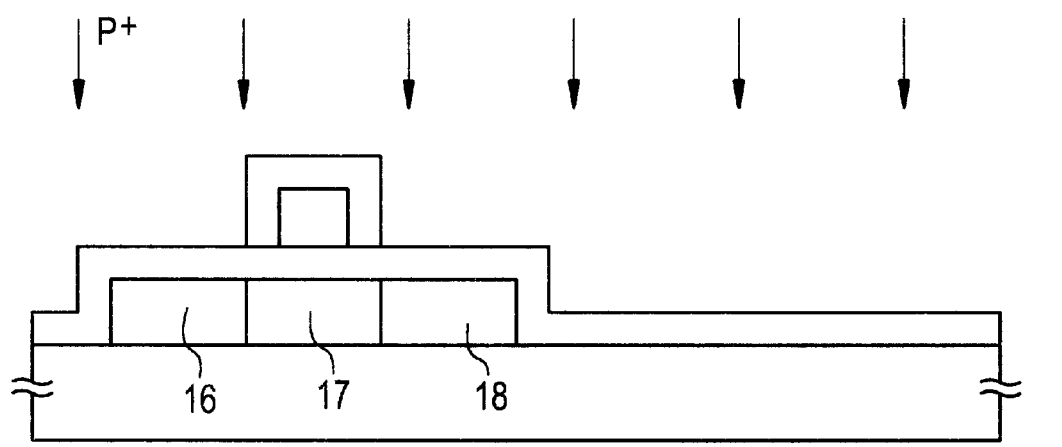
FIGS. 5(A) and 5(B) illustrate a step sequence diagram of a fabrication process for another TFT according to another present example.

Referring to FIG. 5(A), source/drain regions 16 and 18, and a channel forming region 17 were formed in a self-aligned manner after introducing phosphorus (P) by ion implantation. Subsequently, laser beam or IR light was irradiated to anneal the source/drain regions.

Figure 5B:
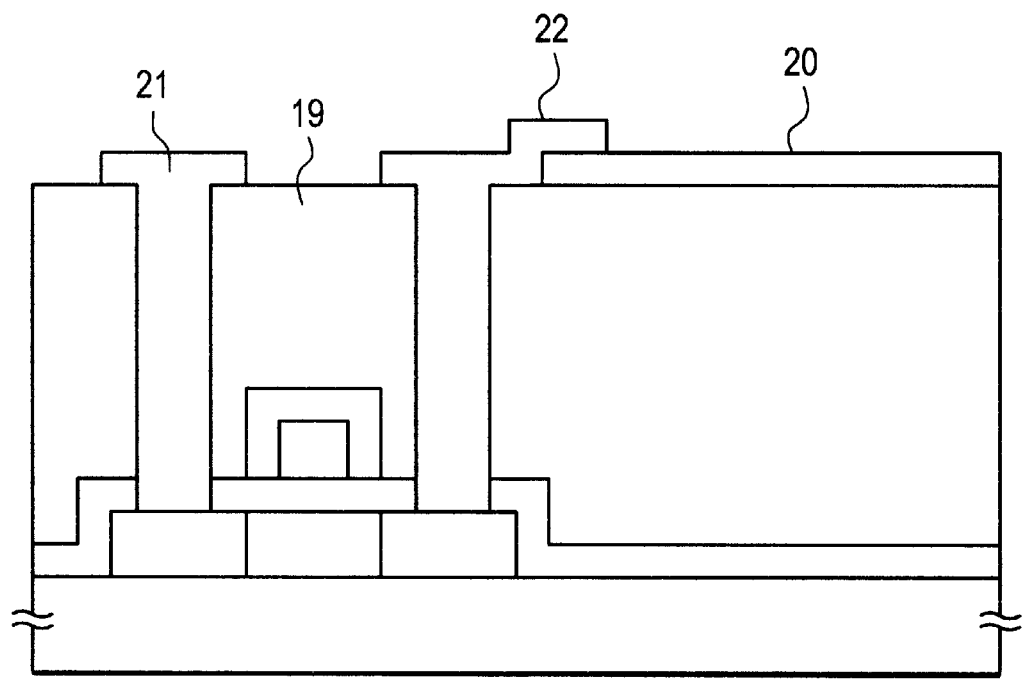

A polyimide film was formed as an interlayer insulator 19, and an ITO electrode 20 as a pixel electrode was formed thereon. Source/drain electrodes 21 and 22 were formed after the perforation step. One of the contacts 22 was connected to the pixel electrode 20. Thus was obtained a complete NTFT provided on a pixel electrode as shown in FIG. 5(B).

The TFT thus obtained comprises a crystalline silicon film composed of silicon crystals having grown oriented along a direction parallel to the substrate. Accordingly, the TFT yields high mobility because the carriers move along the crystal boundary of the one-direction oriented single crystals.

EXAMPLE 6

An example of a circuit structure comprising a PTFT and an NTFT in a complementary manner is described. The structure of the present example is applicable to ICs of image sensors, and pixels and peripheral circuits of liquid crystal display devices.

Referring to FIG. 6, the fabrication process for the present example is described. A 2,000 Å thick silicon oxide film (not shown in the figure) was deposited by sputtering on a glass substrate 11 as a base coating. Then, an amorphous silicon film 12 was deposited thereon by plasma CVD, and was annealed by heating at 600° C. for a duration of 24 hours.

It is extremely favorable to apply annealing using an IR light to the resulting structure after the heating step above for crystallization. The irradiation of an IR light not only eliminates the defects and the dangling bonds in the silicon film, but also improves the crystallinity of silicon and thereby densifies the film. Particularly preferred is the use of a near IR light about 1 to 2 μm in wavelength, because the light in this region is absorbed selectively by the silicon film but not by the glass substrate. Accordingly, the silicon film can be heated to about 800° C. without considerably heating the glass substrate.

Figure 6A:
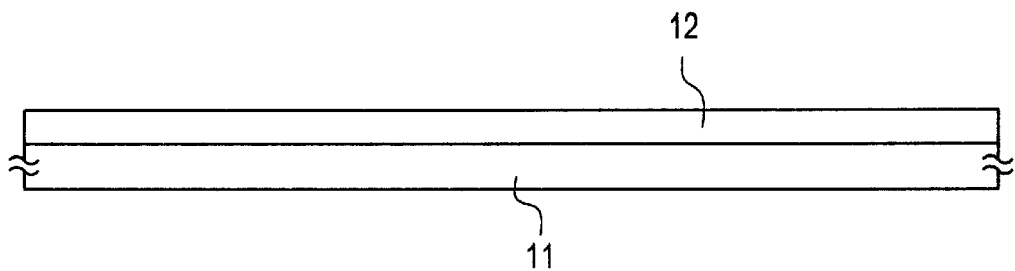
FIGS. 6(A) through 6(D) illustrate a step sequence diagram of a fabrication process for another TFT according to another present example.
Figure 6B:
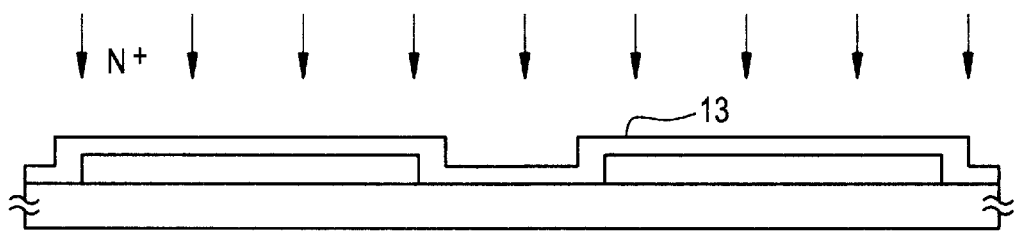
Figure 6C:
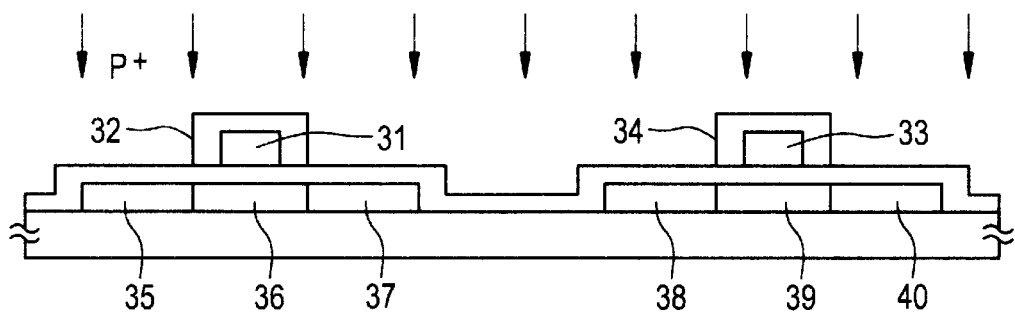
Figure 6D:
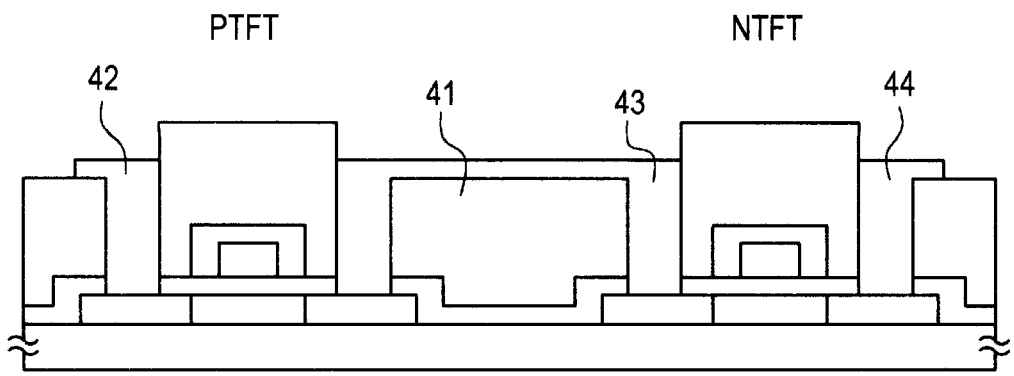

Then, two island-like active layers are established by isolating the elements. These two active layers later become a PTFT and an NTFT. A silicon oxide film 13 as a gate insulator film was deposited thereafter at a thickness of 1,500 Å by sputtering. In the same manner as in Example 5, ion implantation for introducing nitrogen ions into the silicon oxide film was carried out to obtain a silicon oxynitride film 13 as the gate insulator film. The resulting structure is shown in FIG. 6(B).

Gate contacts 31 and 33 were formed by patterning a 6,000 Å thick aluminum film having formed on the gate insulator film 13. The surface of the gate contacts 31 and 33 was oxidized by anodic oxidation to form oxide layers 32 and 33 on the surface of the gate contacts. Furthermore, phosphorus ions and boron ions were introduced in turn into corresponding one of the active layer regions respectively after masking it with a resist. In this manner, P-type portions 35 and 37 and N-type portions 38 and 40 can be obtained. Thus were obtained source/drain regions 35 and 37 for the PTFT together with a channel forming region 36 for the PTFT and source/drain regions 38 and 40 for the NTFT together with a channel forming region 39 for the NTFT in a self-aligned manner. A laser beam or IR light is irradiated thereafter to anneal the source/drain regions. The resulting structure is given in FIG. 6(C).

A polyimide or a silicon oxide film was formed as an interlayer insulator 41, and electrodes 42, 43, and 44 were formed after the perforation step. Thus was realized a complete structure comprising a PTFT and an NTFT whose output are connected with an electrode 43. Thus was obtained a structure shown in FIG. 6(D).

As described in the foregoing, the present invention provides a TFT by a low temperature process and at high yield. In particular, the present invention makes a great contribution to the industry when TFTs are formed on a large area substrate to use in active matrices and driver circuits. Though not specifically described in the examples, the present invention may be applied to the fabrication of a so-called three-dimensional IC by superposing semiconductor ICs on single crystal ICs and other types of ICs. Furthermore, though the examples above referred mainly to various types of LCDs, clearly, the present invention is applicable to circuits which are directly formed on an insulator substrate, such as image sensors. Moreover, the use of a silicon oxynitride film as the gate insulator results in the following advantages.

A dense gate insulator can be obtained; this leads to the solution of the problems of fixed charge inside the gate insulator, static breakdown, and pinholes; and The gate insulator can be formed thickly.

While the invention has been described in detail and with reference to specific embodiments thereof, it will be apparent to one skilled in the art that various changes and modifications can be made therein without departing from the spirit and scope thereof.

What is claimed is:

1. A method for forming a semiconductor device comprising the steps of:

forming a semiconductor film comprising silicon over a substrate, said semiconductor film having a portion to become an active layer of said semiconductor device;

providing said semiconductor film with a metal containing material for promoting crystallization of said semiconductor film;

crystallizing said semiconductor film including said portion wherein said metal diffuses through said semiconductor film;

patterning the crystallized semiconductor film into said active layer;

forming a silicon oxide film containing chlorine on the active layer by chemical vapor deposition;

nitriding only in the vicinity of a surface of said silicon oxide film; and forming a gate electrode on said silicon oxide film.

2. A method for forming a semiconductor device comprising the steps of:

forming a semiconductor film over a substrate, said semiconductor film having a portion to become an active layer of said semiconductor device;

providing said semiconductor film with a metal containing material for promoting crystallization of said semiconductor film;

crystallizing said semiconductor film with said metal containing material wherein said metal diffuses through said portion during the crystallization;

patterning the crystallized film into said active layer;

forming a gate insulating film comprising silicon oxide on the active layer;

nitriding only in the vicinity of a surface of said gate insulating film; and forming a gate electrode on said gate insulating film, wherein said gate insulating film is doped with a gettering material.

3. A method for forming a semiconductor device comprising the steps of:

forming a semiconductor film over a substrate, said semiconductor film having a portion to become an active layer of said semiconductor device;

providing said semiconductor film with a metal containing material;

crystallizing said semiconductor film wherein said metal diffuses through said portion during the crystallization;

forming a gate insulating film comprising silicon oxide on the crystallized semiconductor film by chemical vapor deposition;

nitriding only in the vicinity of a surface of said gate insulating film; and forming a gate electrode on said gate insulating film, wherein said gate insulating film is deposited with chlorine.

4. A method for forming a semiconductor device comprising the steps of:

forming a semiconductor film over a substrate;

providing said semiconductor film with a metal containing material for promoting crystallization of said semiconductor film;

crystallizing said semiconductor film wherein said metal diffuses through the semiconductor film during the crystallization;

forming an insulating film comprising silicon oxide on the crystallized semiconductor film by chemical vapor deposition wherein a gettering material is added into said insulating film; and nitriding only in a vicinity of a surface of said insulating film.

5. A method according to claim 1 wherein said metal is selected from the group consisting of nickel, iron, cobalt, ruthenium, rhodium, palladium, osmium, iridium, platinum, scandium, titanium, vanadium, chromium, manganese, copper, zinc, gold, and silver.

6. A method according to claim 3 wherein said metal is selected from the group consisting of nickel, iron, cobalt, ruthenium, rhodium, palladium, osmium, iridium, platinum, scandium, titanium, vanadium, chromium, manganese, copper, zinc, gold, and silver.

7. A method according to claim 3 wherein said metal is selected from the group consisting of nickel, iron, cobalt, ruthenium, rhodium, palladium, osmium, iridium, platinum, scandium, titanium, vanadium, chromium, manganese, copper, zinc, gold, and silver.

8. A method according to claim 3 wherein said metal is selected from the group consisting of nickel, iron, cobalt, ruthenium, rhodium, palladium, osmium, iridium, platinum, scandium, titanium, vanadium, chromium, manganese, copper, zinc, gold, and silver.

9. A method for forming a semiconductor device comprising the steps of:

preparing a crystalline semiconductor film comprising silicon;

forming a gate insulating film comprising silicon oxide over said crystalline semiconductor film;

nitriding only the vicinity of a surface of said gate insulating film, and forming a gate electrode on said gate insulating film.

10. A method according to claim 9, wherein said gate insulating film is formed by a chemical vapor deposition.

11. A method according to claim 9, wherein the nitriding process is performed by implantation of a nitrogen ion into said gate insulating film.

12. A method for forming a semiconductor device comprising the steps of:

preparing a crystalline semiconductor film comprising silicon;

forming a gate insulating film comprising silicon oxide over said crystalline semiconductor film;

introducing a nitrogen element into said gate insulating film for nitriding only the vicinity of a surface thereof; and forming a gate electrode on said gate insulating film.

13. A method according to claim 12, wherein said gate insulating film is formed by a chemical vapor deposition.

14. A method according to claim 12, wherein said nitrogen element is a nitrogen ion.

15. A method for forming a semiconductor device comprising the steps of:

preparing a crystalline semiconductor film comprising silicon;

forming a silicon oxide film over said crystalline semiconductor film;

forming a silicon oxynitride film by nitriding only the vicinity of a surface of said silicon oxide film, and forming a gate electrode on said silicon oxynitride film.

16. A method according to claim 15, wherein said silicon oxide film is formed by a chemical vapor deposition.

17. A method according to claim 15, wherein said oxynitride film is expressed by $SiO_xN_y$, wherein x is from 0 to 2 and y is from 0 to 4/3.

18. A method for forming a semiconductor device comprising the steps of:

preparing a crystalline semiconductor film comprising silicon;

forming a gate insulating film comprising silicon oxide over said crystalline semiconductor film;

nitriding only the vicinity of a surface of said gate insulating film, and forming a gate electrode on said gate insulating film, wherein said gate insulating film contains halogen element.

19. A method according to claim 18, wherein said silicon oxide film is formed by a chemical vapor deposition.

20. A method according to claim 18, wherein the nitriding process is performed by implantation of a nitrogen ion into said gate insulating film.

21. A method according to claim 18, wherein said halogen element is chlorine.

22. A method for forming a semiconductor device comprising the steps of:

preparing a crystalline semiconductor film comprising silicon;

forming a gate insulating film comprising silicon oxide over said crystalline semiconductor film;

introducing a nitrogen element into said gate insulating film for nitriding only the vicinity of a surface thereof, and forming a gate electrode on said gate insulating film, wherein said gate insulating film contains halogen element.

23. A method according to claim 22, wherein said silicon oxide film is formed by a chemical vapor deposition.

24. A method according to claim 22, wherein said nitrogen element is a nitrogen ion.

25. A method according to claim 22, wherein said halogen element is chlorine.

26. A method for forming a semiconductor device comprising the steps of:

preparing a crystalline semiconductor film comprising silicon;

forming a silicon oxide film over said crystalline semiconductor film;

forming a silicon oxynitride film by nitriding only the vicinity of a surface of said silicon oxide film, and forming a gate electrode on said silicon oxynitride film;

wherein said gate insulating film contains halogen element.

27. A method according to claim 26, wherein said silicon oxide film is formed by a chemical vapor deposition.

28. A method according to claim 26, wherein said oxynitride film is expressed by $SiO_xN_y$, wherein x is from 0 to 2 and y is from 0 to 4/3.

29. A method according to claim 26, wherein said halogen element is chlorine.

* * * * *